United States Patent
Cline et al.

(10) Patent No.: US 7,808,257 B2
(45) Date of Patent: Oct. 5, 2010

(54) IONIZATION TEST FOR ELECTRICAL VERIFICATION

(75) Inventors: Christopher W. Cline, Hopewell Junction, NY (US); Edward J. Yarmchuk, Mahopac, NY (US); Vincent A. Arena, Putnam Valley, NY (US); Donald A. Merte, Poughkeepsie, NY (US); Thomas Picunko, Scarsdale, NY (US); Brian J. Wojszynski, Hyde Park, NY (US); Charles J. Hendricks, Wappingers Falls, NY (US); Michael E. Scaman, Goshen, NY (US); Robert S. Olyha, Jr., Poughkeepsie, NY (US); Arnold Halperin, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 10/595,541

(22) PCT Filed: Nov. 12, 2003

(86) PCT No.: PCT/US03/36093
§ 371 (c)(1), (2), (4) Date: Apr. 27, 2006

(87) PCT Pub. No.: WO2005/057228
PCT Pub. Date: Jun. 23, 2005

(65) Prior Publication Data
US 2007/0108984 A1    May 17, 2007

(51) Int. Cl.
*G01R 31/302* (2006.01)

(52) U.S. Cl. .................................................... 324/750
(58) Field of Classification Search .................. None
See application file for complete search history.

(56) References Cited

U.S. PATENT DOCUMENTS

| 3,531,716 A | 9/1970 | Tarui et al. |
| 3,611,074 A | 10/1971 | Weichardt |
| 3,649,830 A | 3/1972 | Sato et al. |
| 3,764,898 A | 10/1973 | Bohlen et al. |
| 3,783,283 A | 1/1974 | Smith, Jr. |
| 3,796,947 A | 3/1974 | Harrod et al. |
| 3,970,892 A | 7/1976 | Wakalopulos |
| 4,053,833 A | 10/1977 | Malmberg et al. |
| 4,112,299 A | 9/1978 | Davis |
| 4,189,642 A | 2/1980 | Justus et al. |
| 4,326,165 A | 4/1982 | Szedon |
| 4,650,333 A | 3/1987 | Crabb et al. |
| 4,663,526 A | 5/1987 | Kamieniecki |
| 4,780,680 A | 10/1988 | Reuter et al. |
| 4,812,756 A | 3/1989 | Curtis et al. |
| 4,963,738 A | 10/1990 | Gundlach et al. |
| 4,985,681 A | 1/1991 | Brunner et al. |

(Continued)

*Primary Examiner*—Jermele M Hollington
(74) *Attorney, Agent, or Firm*—Ian D. MacKinnon

(57) ABSTRACT

A method and apparatus for the non-contact electrical test of both opens and shorts in electronic substrates. Top surface electrical test features are exposed to an ionization source under ambient conditions and the subsequent charge build up is measured as a drain current by probes contacting corresponding bottom surface features. Opens are detected by an absence of a drain current and shorts are detected by turning off the ionization source and re-measuring the bottom surface probes with a varying bias applied to each probe in the array.

63 Claims, 6 Drawing Sheets

U.S. PATENT DOCUMENTS

| | | |
|---|---|---|
| 5,179,279 A | 1/1993 | Millard et al. |
| 5,202,623 A | 4/1993 | LePage |
| 5,216,362 A | 6/1993 | Verkuil |
| 5,266,892 A | 11/1993 | Kimura |
| 5,417,494 A | 5/1995 | Kempa et al. |
| 5,485,091 A | 1/1996 | Verkuil |
| 5,508,507 A | 4/1996 | Nelson et al. |
| 5,587,584 A | 12/1996 | Bergen |
| 5,587,664 A | 12/1996 | Banitt et al. |
| 5,644,223 A | 7/1997 | Verkuil |
| 5,767,693 A | 6/1998 | Verkuil |
| 5,818,239 A * | 10/1998 | Scaman ............ 324/537 |
| 5,883,437 A | 3/1999 | Maruyama et al. |
| 5,936,408 A | 8/1999 | Scaman |
| 6,043,665 A | 3/2000 | Nishioka et al. |
| 6,064,845 A | 5/2000 | Suzuki |
| 6,100,698 A | 8/2000 | Megerle et al. |
| 6,208,499 B1 | 3/2001 | Yonekawa et al. |
| 6,538,462 B1 | 3/2003 | Lagowski et al. |

\* cited by examiner

IONIZATION TEST FOR ELECTRICAL VERIFICATION

BACKGROUND OF THE INVENTION

The present invention is directed to the electrical testing of electronic packaging and, more particularly, is directed to an apparatus and method for the non-contact electrical test of electronic packaging using ionization under standard atmospheric conditions.

As modules and board geometry get smaller with increasing demands for high volume testing in a cost competitive manner there is a need to have a test applicable to fine geometries while remaining fast, inexpensive and practical in a high volume manufacturing environment.

One significant class of nets to test in the area of electronic cards and modules are conductive nets from one side of the module to the other. An open or shorting defect in these nets would be a yield detractor. Even if a circuit is not a dead open, if it violates a minimum conductive area criteria there could be reliability or other yield related problems. Each side of the electronic package has features and will be used to attach in some manner to some other electronic package. One side of an electronic module or board will usually attach to a finer geometric ground rule device such as a semiconductor chip. This side is typically referred to as the top side metallurgy (TSM). The other side will usually attach to a coarse geometry ground rule device such as a board, back plane or other packaging module.

Due to the small geometries of the TSM it may not be desirable from a handling point of view to mechanically probe the top for some or all electrical test purposes. Similarly, due to the small geometries of the TSM it may not be practical or even possible to mechanically probe the TSM. The opposite side, typically referred to as the bottom surface metallurgy (BSM), has a coarser geometry and larger pads. The BSM is therefore more practical to mechanically contact for test purposes. Nets connecting the TSM features to the BSM features are critical to the operation of the device and requires test to assure functionality. The present invention includes the use of an ionization source, a mechanical fixture and an array of weak current sensing analog electronics. The same apparatus can be used to test both opens and shorts. The method does not contact the features on one side of the device under test.

Accordingly, it is a purpose of the present invention to provide a method for the non-contact electrical test of opens.

It is another purpose of the present invention to provide a method for the non-contact electrical test of shorts.

It is another purpose of the present invention to provide to an apparatus for the non-contact electrical test of electronic packaging using ionization under standard atmospheric conditions.

These and other purposes of the present invention will become more apparent after referring to the following description considered in conjunction with the accompanying drawings.

BRIEF SUMMARY OF THE INVENTION

The purposes and advantages of the present invention have been achieved by providing a combination of an ionization source, fixture and current sensing electronics for a non-contact test of electronics boards and modules which may be used in standard atmospheric conditions. The opens test may be done by itself or in conjunction with a shorts test using the same apparatus. The shorts test may also be done separately with a simplified apparatus. This method does not contact the features on one side of the device under test.

The present invention provides an apparatus for the non-contact electrical test of electronic substrates comprising: at least one electronic substrate having top surface conductive features in electrical contact with bottom surface conductive features; an ionization source positioned above the top surface features and connected to a first voltage source; a fixture holding the electronic substrate; an array of probes which contact the bottom surface conductive features; a second voltage source electrically connected to the array of probes to maintain the array of probes at virtual ground; and current (measuring) sensing electronics in contact with the array of probes.

The ionization source may be a conductive wire, a mesh of conductive wires, a conductive ribbon or similar structure. The ionization source is preferably coated with molybdenum disulfide. The invention may further comprise a shield between the ionization source and the top surface conductive features. The shield may have a cylindrical shape with an opening towards the top surface conductive features and may connected to a third voltage source. The shield may also be segmented with each segment electrically insulated from each other and separately charged. In a preferred embodiment the first voltage is approximately 5,000 volts, the second voltage is approximately ground and the third voltage is approximately 2,500 volts. The ionization source may be a positive ionization source or a negative ionization source.

The fixture used to hold the substrate may be comprised of a conductive material. The fixture may have a tapered geometry. The fixture may be connected to a fourth voltage source. The fourth voltage may have a value between the first voltage and the second voltage or, alternatively, the fourth voltage may be approximately ground. The current sensing (measuring) electronics are preferably logarithmic amplifiers where each of the individual logarithmic amplifiers are connected to each of the individual probes of the array.

The apparatus may further comprise circuitry connected to the array of probes to allow the current (measuring) sensing electronics to be monitored individually with signals issued through a digital interface from a computer. The apparatus may further comprise an analog-to-digital converter to acquire and store measurements of the analog voltage level from the logarithmic amplifiers. The logarithmic amplifiers may be either unipolar or bipolar.

The present invention also provides a method for the non-contact electrical opens test of electronic substrates comprising the steps of: providing at least one electronic substrate having top surface conductive features in electrical contact with bottom surface conductive features; securing the electronic substrate in a fixture; creating a region of ionized particles at an ionization source positioned above the top surface features by applying a first voltage to the ionization source; exposing the top surface conductive features to a cascade of ionized particles by applying a second voltage to the bottom surface conductive features and thereby creating an electric charge buildup on the top surface conductive features; draining the charge buildup through the bottom surface conductive features and creating a drain current into an array of probes in contact with the bottom surface conductive features; and measuring the drain current with current sensing electronics in contact with the array of probes whereby any opens between a top surface conductive feature and a bottom surface conductive feature is detected by the absence of the drain current.

The present invention also provides a method for the non-contact electrical shorts test of electronic substrates comprising the steps of: providing at least one electronic substrate having top surface conductive features in electrical contact with bottom surface conductive features; securing the electronic substrate in a fixture; creating a region of ionized particles at an ionization source positioned above the top surface features by applying a first voltage to the ionization source; exposing the top surface conductive features to a cascade of ionized particles by applying a second voltage to the bottom surface conductive features and thereby creating an electric charge buildup on the top surface conductive features; draining the charge buildup through the bottom surface conductive features and creating a drain current into an array of probes in contact with the bottom surface conductive features; measuring the drain current with current sensing electronics in contact with the array of probes whereby any opens between a top surface conductive feature and a bottom surface conductive feature is detected by the absence of the drain current; turning off the cascade of ionized particles; applying a different voltage bias on each individual probe in the array of probes; and re-measuring the array of probes with the current sensing electronics whereby any shorts are detected by a drain current.

Either the open or shorts test may further comprise the step of first measuring the voltage bias of each of the array of probes with no ionization source and no electronic substrate in place to establish reference values for subsequent drain current measurements.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The purposes of the present invention have been achieved by providing a combination of an ionization source, fixture and current sensing electronics for a noncontact test of electronic substrates, such as electronic boards and modules, which may be used in standard atmospheric conditions for both opens and shorts testing. The method does not mechanically contact the features on one side of the device under test. The ionization source exposes an area to a "rain" of charged particles while the features under test are held at virtual ground attracting them. The charge drains through the part to a probe or array of probes and the current is sensed and used to detect opens in the part under test. This method lends itself to high speed, high volume manufacturing.

Figure 1:
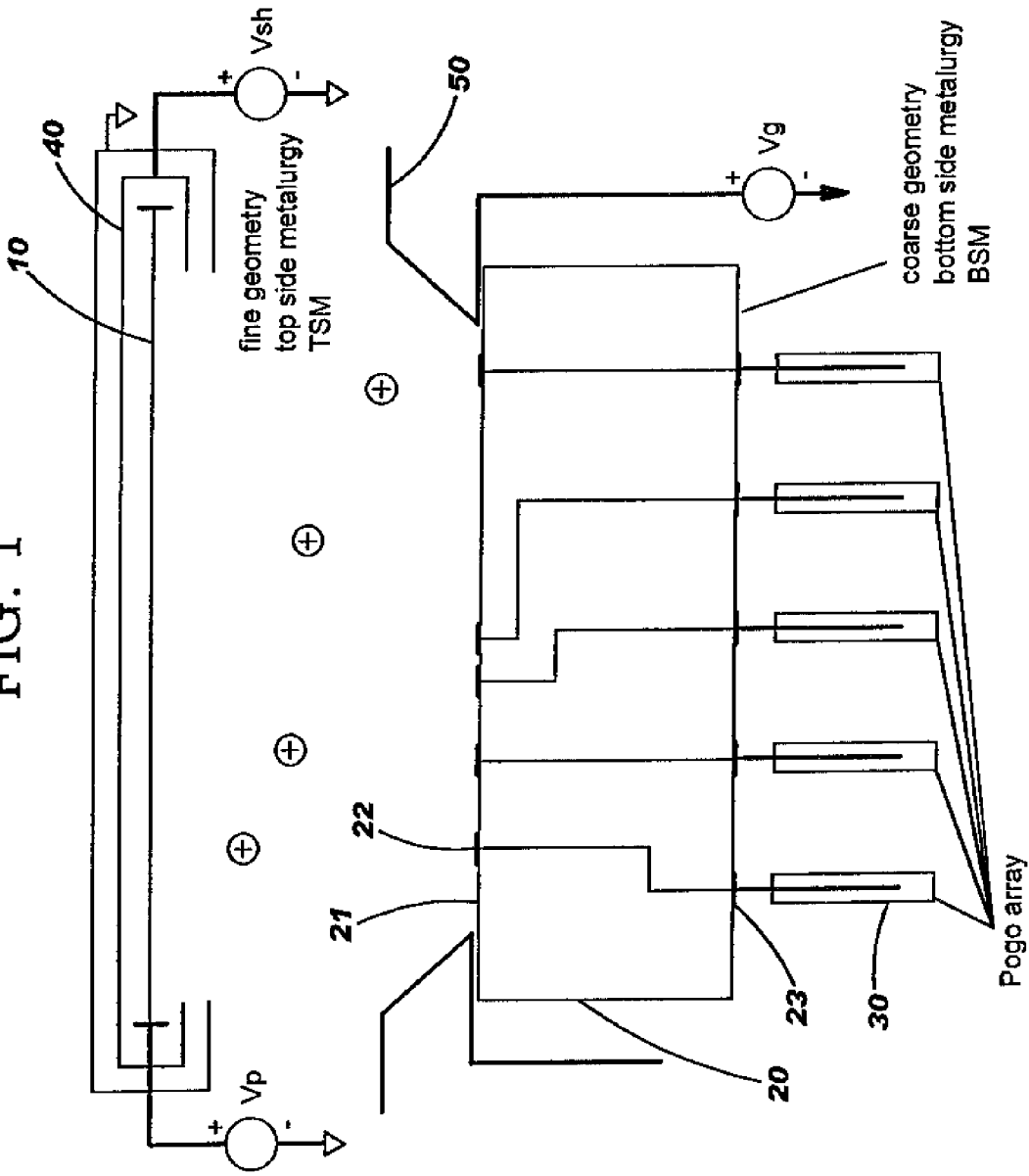
FIGS. 1-6 are schematic views of various embodiments of the present invention.

Referring to FIG. 1 the present invention uses an ionization source 10 that can be operated at room pressure in a manufacturing environment. The ionization source is positioned in proximity to the electronic substrate 20 to be tested. The ionization source will bombard the TSM 21 with charged particles. The BSM pads 23 contact a mechanical array of probes 30 which are at virtual ground voltage (Vg) which will cause the associated TSM pads 22 on the same conductive net to also be at virtual ground and attract the ions, causing a current collected on the associated TSM pads 22 to drain to the associated BSM pads 23 and allowing a test to be performed for electrical opens or electrical shorts. If the net is good and does not have an open, charge will drain through the net, causing a weak current, referred to as a "drain current", which is detected by current sensing electronics (not shown) connected to the probe array causing an output change. If the net contains an open the electronics output will be unchanged. That is to say nets with an open will be detected by the absence of this drain current. In this way a drain current will either flow or not flow and an open can be detected.

The present invention provides a source of ions at room pressure and without gasses other than ordinary air. In a preferred embodiment this is accomplished using a thin wire, or mesh of wires, at high voltage (Vp). This allows a high voltage gradient producing the greater ionization source. The ionization source of the present invention is not limited to a wire or mesh of wires. One skilled in the art could construct an ionization source using an array of needles or wires; a charged ribbon structure; a comb structure or a metalized strip saw tooth structure. In a preferred embodiment it is desirable to coat the selected ionization source structure with appropriate material to enhance ion production, such as electrically conductive molybdenum disulfide.

In a preferred embodiment the invention the ionization source would include a shield 40 positioned between the ionization source 10 and TSM pads 22 for the additional focus of the ions toward the target part under test. The shield 40, which provides a conductive background, is held at a voltage (Vsh) that is lower than the ionization source voltage (Vp) but higher than ground (Vg). The shield 40 is held at a voltage (Vsh) between the voltage of the ionization source (Vp) and the virtual ground of the target (Vg) for focusing purposes, allowing the target area TSM 21 to be at the greatest potential drop relative to the ionization source 10 in order to attract the most ions.

The geometry of the shield 40 is readily tailored to focus the charge more efficiently onto the target 21. In a preferred embodiment the shield 40 is made of conductive or semi conductive material and is cylinder shaped with an opening facing the part under test. The shield may also be segmented where each segment is insulated from each other and separately charged for improved charge focus onto the target with a grounded shield around both the ion source and segmented shield. In a preferred embodiment the ionization source 10 is held at a high potential (Vp) such as 5 kV, the focus shield 40 will be at a lower potential such as 2.5 kV while the features under test 22 will be at virtual ground (Vg).

In a preferred embodiment the most uniform ionization source 10 will be a positive ionization source. A positive ion source refers to a device which removes electrons from atoms or molecules and ejects them as positively charged particles. A negative ionization source would consist of negatively charged ions. While positive or negative charged ions have similar mobility in an electric field in vacuum or air, free electrons are magnitudes lighter and therefore very high mobility in the same field compared with a negatively charged ion with the same charge due to the higher mass of the ion. One non obvious consequence is that the ionization source may have pockets of non-uniformity with a negative source where free electrons are generated rather than ions, making a positive ion source more uniform and a more desirable source of ionization for an ionization test than a negative ionization source.

Another disadvantage of a negative ionization source is that it may produce some amount of ozone, which could be a safety issue for long term exposure. This may necessitate a filter to remove ozone such as a charcoal filter. If one skilled in the art desires further mobility of the ionization a lighter gas such as helium may be used. If one skilled in the art desires to reduce the generation of ozone or other effects related to oxygen a more inert mixture such as nitrogen may be used. Similarly one skilled in the art may extend the approach to other medium such as ionic fluid or other conditions than standard atmospheric mixture and pressure.

Static charge buildup on the parts being tested is not a concern with this method since as charge builds up on the surface it tends to repel additional charge and tends to drain through the good nets, causing the charge buildup to not be significant. Should the need arise, one skilled in the art should be familiar with a wealth of anti-static devices commercially available to remove charge or even to use the ion source in a mode to produce a neutralizing charge by reverse biasing it or producing both positive and negative ions by an alternating bias as need be to remove unwanted charge.

Figure 2:
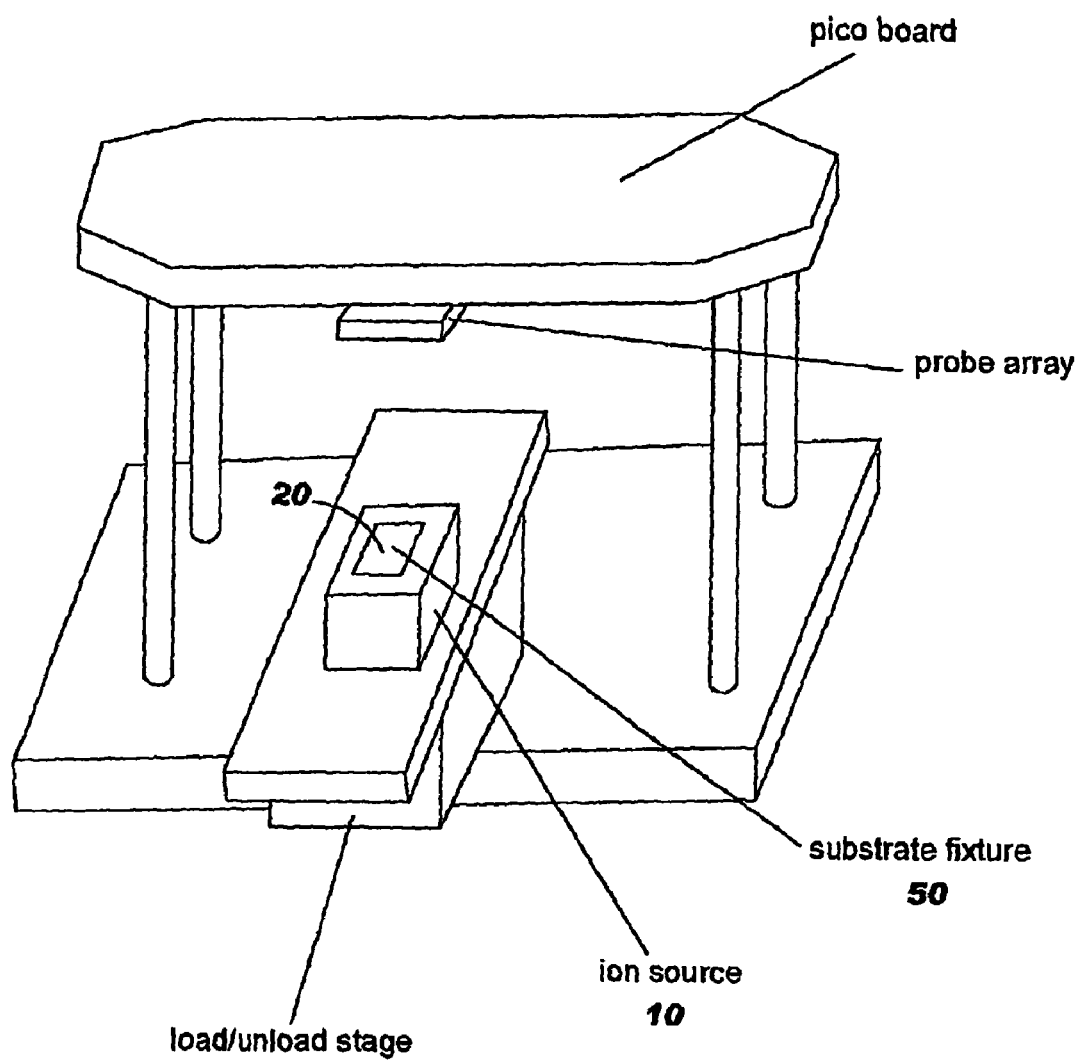

Referring again to FIG. 1, there must be a fixture capable of holding the part securely while allowing all probes of the array 30 to match and make conductive contact to the BSM pads 23 for purposes of a current measurement at each. Referring now to FIG. 2 there is shown a schematic of a preferred embodiment of the present invention. The electronic substrate to be tested 20 is secured by a mechanical fixture 50 for firmly holding the substrate and maintaining a uniform electric field on the TSM. The fixture 50 allows BSM pads of the substrate 20 under test to be pressed securely against the array of probes 30. Each BSM pad 23 is pressed securely against an array probe.

Referring to FIG. 2, in this embodiment the electronic substrate 20 is facing TSM features down and this side is bombarded with positive ionization from an ion source 10 while being pressed upward against the array of probes. In addition the mechanical fixture 50 provides a means to retract the part downward from the array of probes and bring the substrate in contact with or away from the probe array as needed for part load and unload purposes. Such fixtures for holding an article securely and at a precise position for electrical test are numerous and well known in the art.

Figure 3:
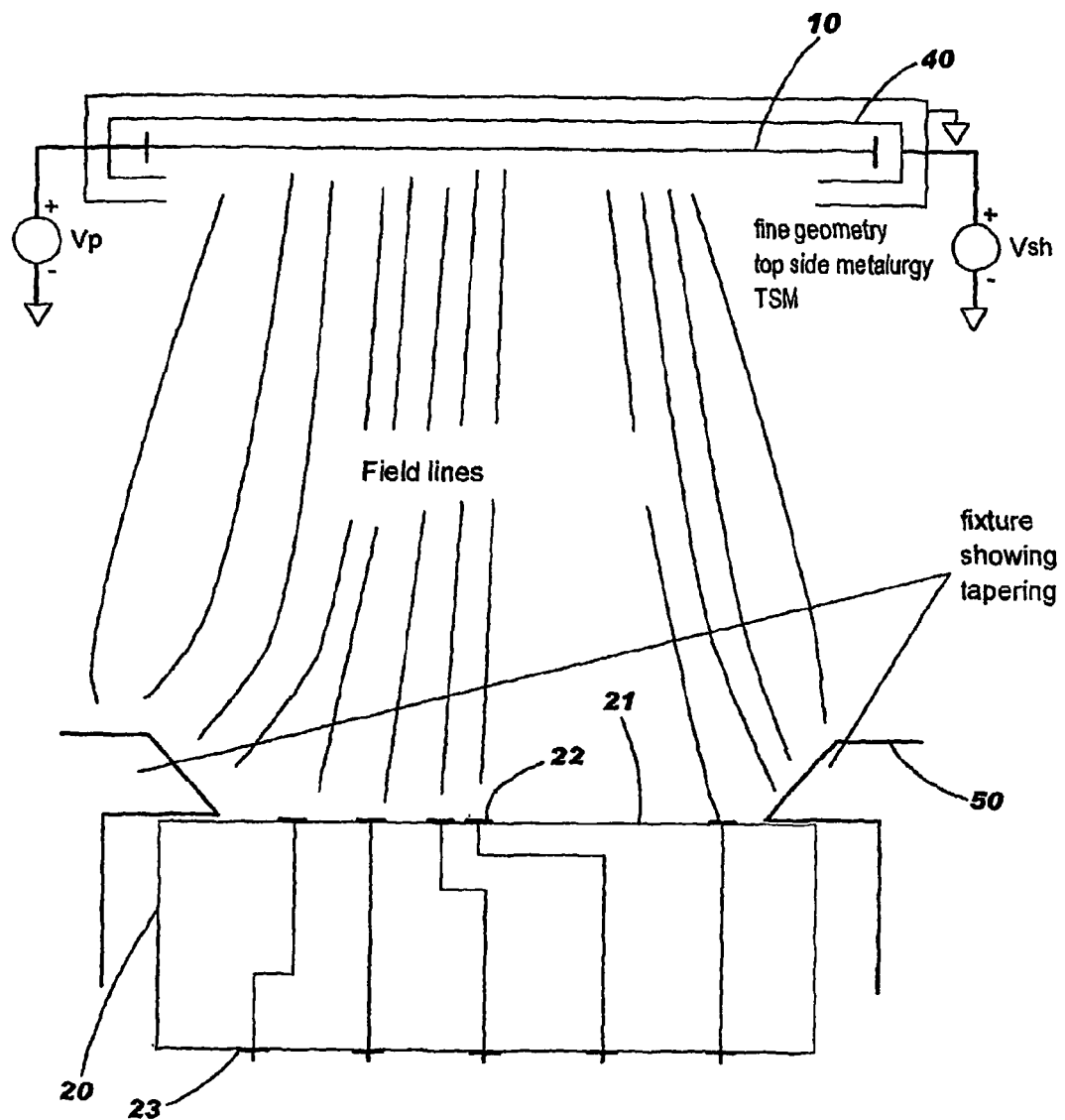

In a preferred embodiment the fixture is made of a conductive material in order to avoid charge buildup which will alter the field with time. Referring to FIG. 3 there is shown another preferred embodiment where the shape of the fixture 50 is tapered to lessen the interference of the fixture 50 with the ionization test. The fixture 50 may be at some voltage (Vf) in between the source voltage (Vp) and the target voltage (Vg). Alternatively, the fixture may be grounded for convenience and simplicity or offset some small amount to improve focus of the ions. Additionally the fixture may be used to monitor the ionization source, holding it as a virtual offset and measuring the ionization "draining" to it in order to monitor whether the ionization source is functioning or to provide additional information helpful in an automatic calibration. One skilled in the art could also use some other well known method of corona discharge if they choose.

The small current from each probe in the mechanical array must be measured. The preferred embodiment of doing this is with Analog Current Sensing Electronics well known in the art. A preferred embodiment uses a conventional logarithmic amplifier which is replicated for each probe of the array. This allows each probe in the array to be monitored individually with signals issued through a digital interface from a computer.

Figure 4:
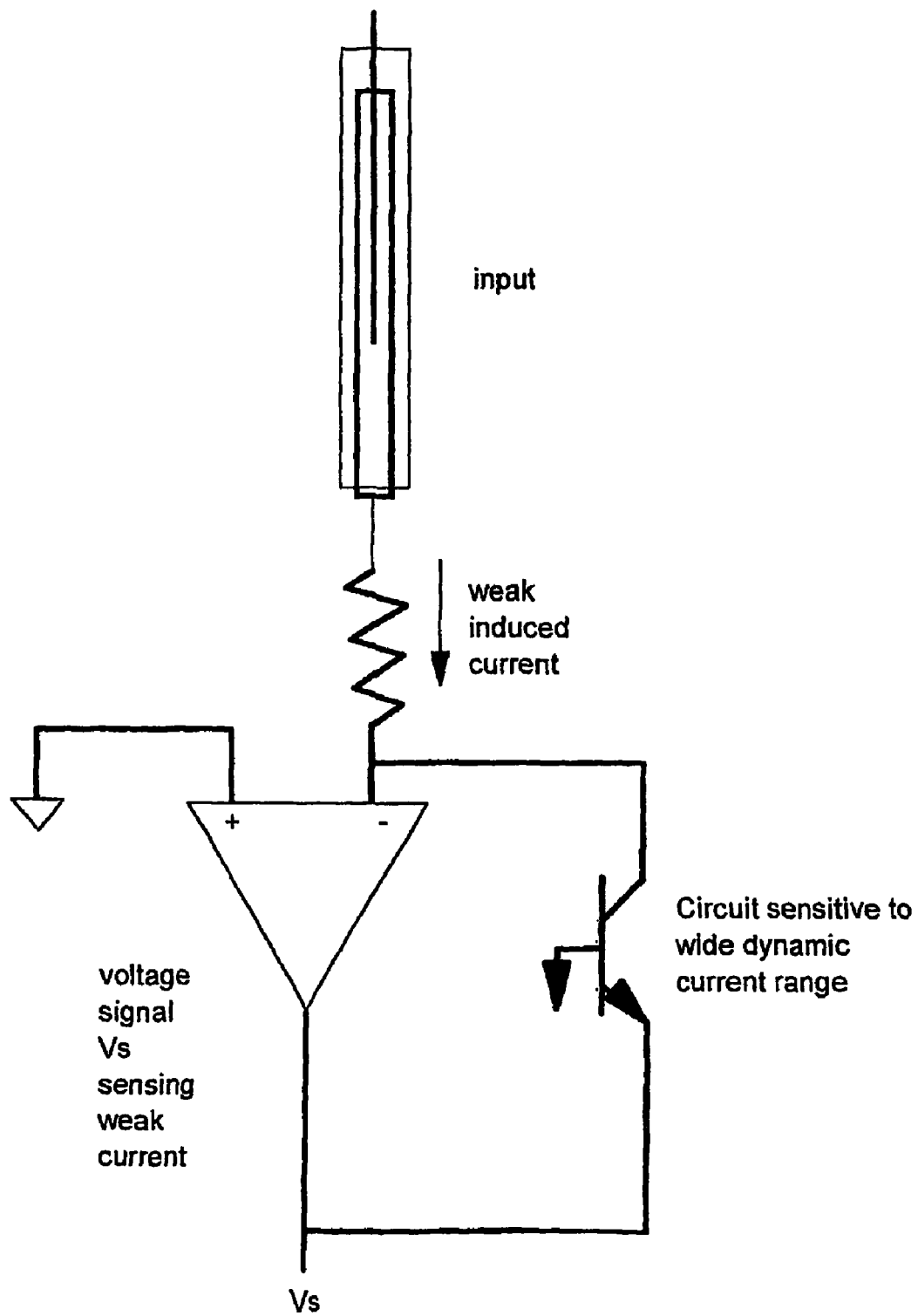

The logarithmic amplifiers will preferably have a wide dynamic range. The number of logarithmic amplifier circuits may be scaled up to as large an array as required. Referring to FIG. 4 there is shown a preferred embodiment using a current sensor capable of detecting a weak current across a wide dynamic range, yet remaining simple and capable of being replicated one for each probe in the array. Part of the desirability of replicating the circuit is the desire to avoid challenges and difficulties of switching a high impedance detector necessary to detect the weak currents induced by the ionization technique. One skilled in the art will be familiar with alternatives to this log amplifier which may also be used in conjunction with the present invention. Any such alternative log amplifiers should preferably lend themselves to being replicated to large dense arrays.

Automated and fast measurement acquisition is achieved by incorporating circuitry to allow the sensor associated with each probe to be addressed individually with commands issued through a digital interface from a computer. The analog voltage level from the selected logarithmic amplifier is presented to an analog interface where an analog-to-digital converter is used to acquire and store measurements under program control. This is also an attractive alternative to many commercially available switching matrices which rely on mechanical relay switching and may be cumbersome and expensive.

One skilled in the art would be able to implement a wide dynamic range current amplifier here as either a unipolar log amp or bipolar amp or some other standard amplifying circuit sensitive to low currents, taking care to use good engineering practices such as shielding. A unipolar design such as the one shown in FIG. 4 will give a zero response for negatively flowing currents and a logarithmic response for positively flowing currents. A measure of negatively flowing currents may be obtained by adding a positive input bias as described in the discussion of shorts testing.

The present invention may also be used for short testing. In the present invention a shorts test is accomplished with the same apparatus as used for an opens test of the top to bottom nets of a electronic substrate. The shorts test may be done by itself or in conjunction with an opens test using the same apparatus or a subset of the apparatus.

Figure 5:
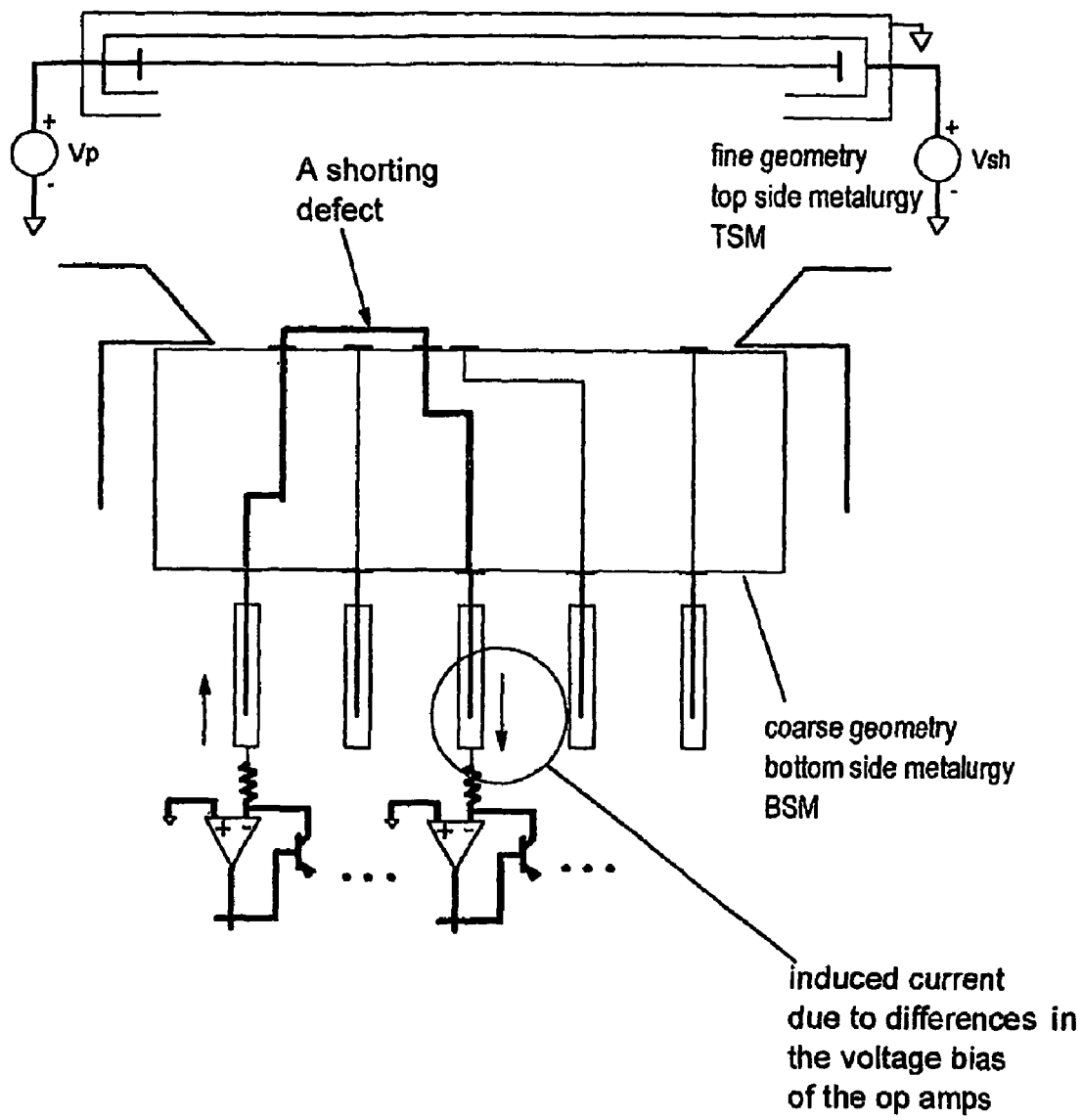

Referring to FIG. 5 there is shown a schematic of a shorts test according to the present invention. In contrast to the induced current for the opens test, in the case of the shorts test the current is induced for a different reason and is due to the either random or intentional differences between the voltage bias of the op amps or may be intentionally introduced with additional bias circuitry to assume each op amp has a slight bias sufficiently different from each other to accomplish the shorts test while still allowing the opens test. In the case of a short one notices that one of the induced currents will be negative of each other and therefore clearly opposite to the direction which would be caused by an induced ionization flow.

A shorts test is accomplished with the same apparatus by turning off the ion source, applying a different voltage bias on each individual probe in the array and re-measuring the probes where any shorts are detected by a drain current. In a preferred embodiment the first step is measuring the voltage bias of each of said array of probes with no ionization source and no electronic substrate in place to establish reference values for subsequent drain current measurements. This base line calibration can of course also be performed prior to the opens test to establish reference values for subsequent drain current measurements for an opens test as well.

If the current mentioned previously is not weak that would indicate a short. If a net is ambiguous and the measurement is neither high enough nor low enough to be classified as open or short it may indicate there is insufficient conductive surface area, possibly due to insufficient surface size or coverage by some contaminant interfering with surface conductivity. Such measurements may be useful as an indicator of insufficient conductive surface area. If the minimum exposed conductive surface area requirement is not met, the induced current will not be as large as expected. The net may then be classified by comparing the measured current to a predetermined minimum threshold for the expected current in that net. Similarly, where some categories of shorts result in large currents, the net may be classified by comparing the measured current to a predetermined maximum threshold for the expected current in that net. Additionally some categories of shorts would cause the current to be too large and may be detected if the measured current at each net is compared to not to exceed the expected current for that net by some threshold.

In addition to the static measurement level, a transient or time sensitive signal may also yield additional information helpful in screening and classifying defects. The measurements may be affected by non-uniformity of the ionization. It would be apparent to one skilled in the art that the sensitivity of the test can be increased by the use of a "profiling process" with one or more known good parts to profile the part applying different thresholds to different nets. The effectiveness of the shorts detection with a profiling process is enhanced under two conditions. First one can take the current sensor measurements for the ambient condition with no ionization and no part. This gives a reading for levels for opens for purposes of threshold selection by individual probe in the array. For further increased sensitivity and to assure shorts detection ability we can purposefully set up each amplifier circuit to have a different voltage input bias to guarantee sufficient differences in input bias for shorts detection while maintaining opens detection ability.

Figure 6:
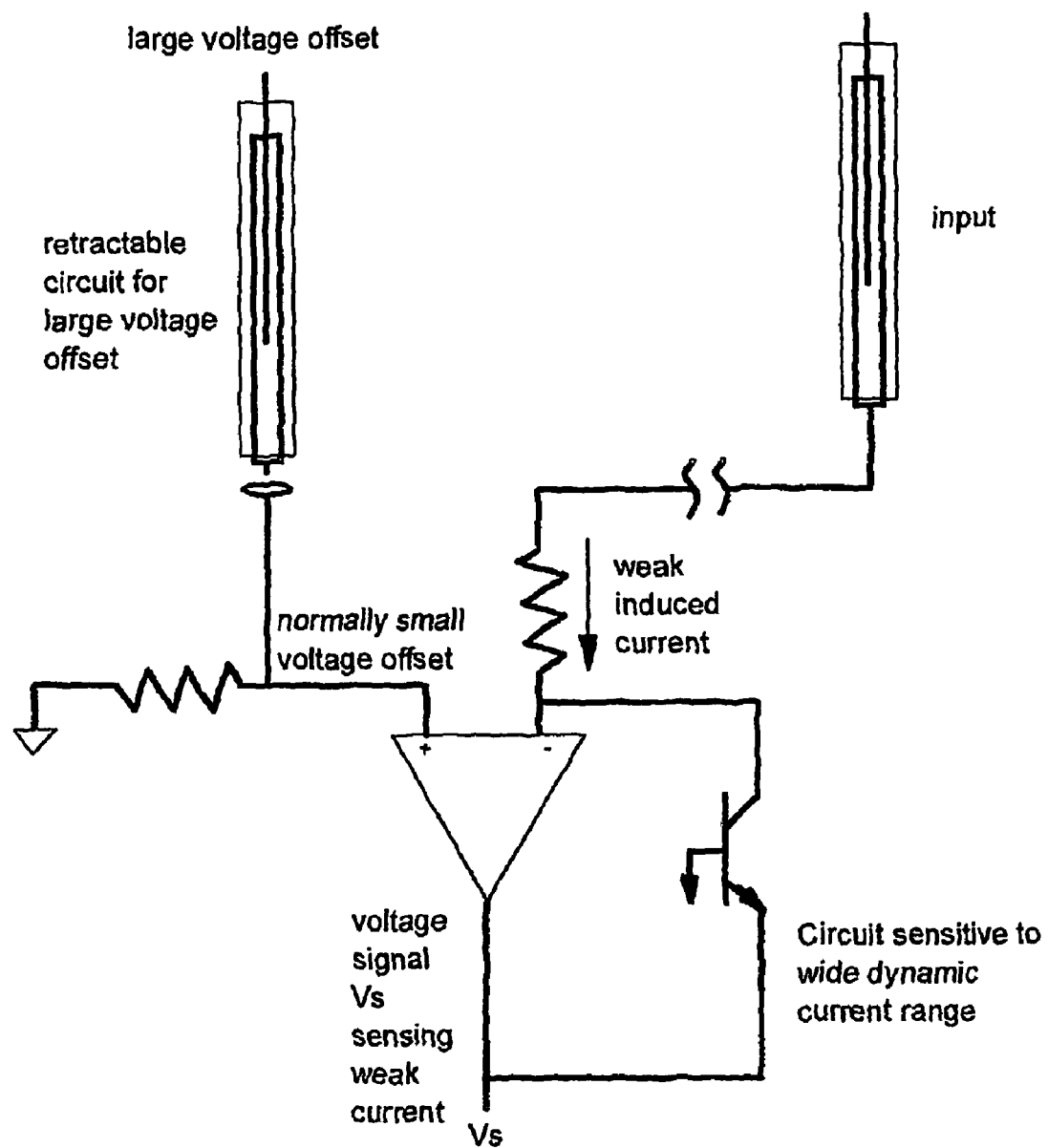

Referring now to FIG. 6, it may be desirable to have an additional test to differentiate high resistance shorts. Normally the input bias of the amplifiers is very small and may be on the order of a millivolt. To measure a weak current it is desirable to have a high input isolation and the addition of a large voltage offset may compromise the isolation. In a preferred embodiment of the present invention the circuit is modified via a contact probe where the contact probe may contact the other side of the part or the special pads of the circuit board that implements the array of sensors. It may be a piggyback card that connects or retracts from the circuit board implementing the array of sensors. Being retractable in any of these ways allows one to dynamically change the offset to be larger or put a selective offset on a particular probe without compromising the input impedance of the current sensing circuit when used in low input bias mode.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An apparatus for the non-contact with the top surface electrical test of electronic substrates comprising:
    at least one electronic substrate having top surface conductive features on a top side of said electronic substrate in electrical contact with bottom surface conductive features on a bottom side of said electronic substrate;
    an ionization source positioned above said top surface of said electronic substrate and connected to a first voltage source;
    a fixture holding said electronic substrate, said fixture comprising a conductive material;
    an array of probes securely in contact with said bottom surface conductive features;
    a second voltage source electrically connected to said array of probes to maintain said array of probes at virtual ground; and
    current measuring electronics in contact with said array of probes.

2. The apparatus of claim 1 wherein said ionization source is a conductive wire.

3. The apparatus of claim 1 wherein said ionization source is a mesh of conductive wires.

4. The apparatus of claim 1 wherein said ionization source is a conductive ribbon.

5. The apparatus of claim 1 wherein said ionization source is coated with molybdenum disulfide.

6. The apparatus of claim 1 further comprising a shield between said ionization source and said top surface conductive features.

7. The apparatus of claim 6 wherein said shield has a cylindrical shape with an opening towards said top surface conductive features.

8. The apparatus of claim 6 wherein said shield is connected to a third voltage source.

9. The apparatus of claim 6 wherein said shield is segmented with each segment electrically insulated from each other and separately charged.

10. The apparatus of claim 8 wherein said first voltage is approximately 5,000 volts, said second voltage is approximately ground and said third voltage is approximately 2,500 volts.

11. The apparatus of claim 1 wherein said ionization source is a positive ionization source.

12. The apparatus of claim 1 wherein said ionization source is a negative ionization source.

13. The apparatus of claim 1 wherein said fixture is comprised of a conductive material.

14. The apparatus of claim 1 wherein said fixture has a tapered geometry.

15. The apparatus of claim 1 wherein said fixture is connected to a fourth voltage source.

16. The apparatus of claim 15 wherein said fourth voltage has a value between said first voltage and said second voltage.

17. The apparatus of claim 15 wherein said fourth voltage is approximately ground.

18. The apparatus of claim 1 wherein said current measuring electronics are logarithmic amplifiers.

19. The apparatus of claim 18 wherein each of said logarithmic amplifiers are connected to said array of probes.

20. The apparatus of claim 18 further comprising circuitry connected to said array of probes to allow said current measuring electronics to be monitored individually with signals issued through a digital interface from a computer.

21. The apparatus of claim 20 further comprising an analog-to-digital converter to acquire and store measurements of the analog voltage level from said logarithmic amplifiers.

22. The apparatus of claim 18 wherein said logarithmic amplifiers are unipolar.

23. The apparatus of claim 18 wherein said logarithmic amplifiers are bipolar.

24. A method for the non-contact with the top surface electrical opens test of electronic substrates comprising the steps of:
    providing at least one electronic substrate having top surface conductive features on a top side of said electronic substrate in electrical contact with bottom surface conductive features on a bottom side of said electronic substrate;

securing said electronic substrate in a fixture;

creating a region of ionized particles at an ionization source positioned above said top surface of said electronic substrate by applying a first voltage to said ionization source wherein said ionization source is a positive ionization source;

exposing said top surface conductive features to a cascade of said ionized particles by applying a second voltage to said bottom surface conductive features and thereby creating an electric charge buildup on said top surface conductive features;

draining said charge buildup through said bottom surface conductive features and creating a drain current into an array of probes in securely in contact with said bottom surface conductive features; and measuring said drain current with current measuring electronics in contact with said array of probes whereby any opens between a top surface conductive feature and a bottom surface conductive feature is detected by the absence of said drain current.

25. The method of claim 24 wherein said ionization source is a conductive wire.

26. The method of claim 24 wherein said ionization source is a mesh of conductive wires.

27. The method of claim 24 wherein said ionization source is a conductive ribbon.

28. The method of claim 24 wherein said ionization source is coated with molybdenum disulfide.

29. The method of claim 24 further comprising the step of focusing said cascade of ionized particles by positioning a shield between said ionization source and said top surface conductive features.

30. The method of claim 29 wherein said shield has a cylindrical shape with an opening towards said top surface conductive features.

31. The method of claim 29 further comprising the step of applying a third voltage to said shield.

32. The method of claim 29 wherein said shield is segmented, with each segment electrically insulated from each other and separately charged.

33. The method of claim 31 wherein said first voltage is approximately 5,000 volts, said second voltage is approximately ground and said third voltage is approximately 2,500 volts.

34. The method of claim 24 wherein said ionization source is a positive ionization source.

35. The method of claim 24 wherein said ionization source is a negative ionization source.

36. The method of claim 24 further comprising the step of applying a fourth voltage to said fixture.

37. The method of claim 36 wherein said fourth voltage has a value between said first voltage and said second voltage.

38. The method of claim 36 wherein said fourth voltage is approximately ground.

39. The method of claim 24 wherein said current measuring electronics are logarithmic amplifiers.

40. The method of claim 39 further comprising the step of monitoring said array of probes individually with circuitry connected to said current measuring electronics which measure signals issued through a digital interface from a computer.

41. The method of claim 40 further comprising the step of storing measurements of the analog voltage level from said logarithmic amplifiers from an analog-to-digital converter.

42. The method of claim 39 wherein said logarithmic amplifiers are unipolar.

43. The method of claim 39 wherein said logarithmic amplifiers are bipolar.

44. The method of claim 24 further comprising the step of first measuring the voltage bias of each of said array of probes with no ionization source and no electronic substrate in place to establish reference values for subsequent drain current measurements.

45. A method for the non-contact with the top surface electrical opens test of electronic substrates comprising the steps of:

providing at least one electronic substrate having top surface conductive features on a top side of said electronic substrate in electrical contact with bottom surface conductive features on a bottom side of said electronic substrate;

securing said electronic substrate in a fixture;

creating a region of ionized particles at an ionization source positioned above said top surface of said electronic substrate by applying a first voltage to said ionization source wherein said ionization source is a negative ionization source;

exposing said top surface conductive features to a cascade of said ionized particles by applying a second voltage to said bottom surface conductive features and thereby creating an electric charge buildup on said top surface conductive features;

draining said charge buildup through said bottom surface conductive features and creating a drain current into an array of probes in securely in contact with said bottom surface conductive features; and measuring said drain current with current measuring electronics in contact with said array of probes whereby any opens between a top surface conductive feature and a bottom surface conductive feature is detected by the absence of said drain current.

46. The method of claim 45 wherein said ionization source is a conductive wire.

47. The method of claim 45 wherein said ionization source is a mesh of conductive wires.

48. The method of claim 45 wherein said ionization source is a conductive ribbon.

49. The method of claim 45 wherein said ionization source is coated with molybdenum disulfide.

50. The method of claim 45 further comprising the step of focusing said cascade of ionized particles by positioning a shield between said ionization source and said top surface conductive features.

51. The method of claim 50 wherein said shield has a cylindrical shape with an opening towards said top surface conductive features.

52. The method of claim 50 further comprising the step of applying a third voltage to said shield.

53. The method of claim 50 wherein said shield is segmented, with each segment electrically insulated from each other and separately charged.

54. The method of claim 31 wherein said first voltage is approximately 5,000 volts, said second voltage is approximately ground and said third voltage is approximately 2,500 volts.

55. The method of claim 45 further comprising the step of applying a fourth voltage to said fixture.

56. The method of claim 55 wherein said fourth voltage has a value between said first voltage and said second voltage.

57. The method of claim 55 wherein said fourth voltage is approximately ground.

58. The method of claim 45 wherein said current measuring electronics are logarithmic amplifiers.

59. The method of claim 58 further comprising the step of monitoring said array of probes individually with circuitry connected to said current measuring electronics which measure signals issued through a digital interface from a computer.

60. The method of claim 59 further comprising the step of storing measurements of the analog voltage level from said logarithmic amplifiers from an analog-to-digital converter.

61. The method of claim 58 wherein said logarithmic amplifiers are unipolar.

62. The method of claim 58 wherein said logarithmic amplifiers are bipolar.

63. The method of claim 45 further comprising the step of first measuring the voltage bias of each of said array of probes with no ionization source and no electronic substrate in place to establish reference values for subsequent drain current measurements.

* * * * *